United States Patent
Nakayama et al.

(10) Patent No.: US 8,945,801 B2
(45) Date of Patent: Feb. 3, 2015

(54) METHOD FOR CREATING MASK DATA, PROGRAM, INFORMATION PROCESSING APPARATUS, AND METHOD FOR MANUFACTURING MASK

(71) Applicant: Canon Kabushiki Kaisha, Tokyo (JP)

(72) Inventors: Ryo Nakayama, Utsunomiya (JP); Tadashi Arai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/023,845

(22) Filed: Sep. 11, 2013

(65) Prior Publication Data

US 2014/0080041 A1    Mar. 20, 2014

(30) Foreign Application Priority Data

Sep. 14, 2012   (JP) ................. 2012-203005

(51) Int. Cl.
*G06F 17/50*   (2006.01)
*G03F 1/70*    (2012.01)

(52) U.S. Cl.
CPC . *G06F 17/50* (2013.01); *G03F 1/70* (2013.01)
USPC ............. 430/5; 430/30; 430/311; 430/396; 716/50; 716/55

(58) Field of Classification Search
CPC .................... G03F 1/70; G06F 17/50
USPC ............. 430/5, 30, 311, 396; 716/50, 55
See application file for complete search history.

(56) References Cited

U.S. PATENT DOCUMENTS

2005/0064302 A1    3/2005   Kotani et al.

FOREIGN PATENT DOCUMENTS

JP    2005-084101 A    3/2005

OTHER PUBLICATIONS

Michael C. Smayling, Hua-yu Liu ; Lynn Cai, Low k1 Logic Design using Gridded Design Rules, Design for Manufacturability through Design-Process Integration II, San Jose, CA, Feb. 24, 2008, SPIE Proceedings, Mar. 4, 2008, vol. 6925, Article 69250B, SPIE, Bellingham, WA, 2008.

*Primary Examiner* — Christopher Young
(74) *Attorney, Agent, or Firm* — Canon USA Inc IP Division

(57) ABSTRACT

Data regarding a first corrected patterns on a single cell corrected such that an evaluation value of a pattern formed on a substrate after an image of a pattern of the single cell is projected onto a resist on the substrate and the resist is developed is obtained for each of a plurality of cells, a first evaluation value obtained by evaluating a projected image of the first corrected pattern on the single cell generated by the projection system is obtained for each of the cells, a second evaluation value obtained by, when the cells are arranged adjacent to one another, evaluating the projected images of the first corrected patterns on the cells is calculated, and creating a second corrected pattern by correcting the first corrected patterns on the cells arranged adjacent to one another such that the second evaluation value becomes close to the first evaluation value.

13 Claims, 7 Drawing Sheets

METHOD FOR CREATING MASK DATA, PROGRAM, INFORMATION PROCESSING APPARATUS, AND METHOD FOR MANUFACTURING MASK

BACKGROUND OF THE INVENTION

1. Field of the Invention

The present disclosure relates to a method for creating mask data, a program, an information processing apparatus, and a method for manufacturing a mask.

2. Description of the Related Art

In order to fabricate a semiconductor device, an exposure apparatus illuminates a mask and projects images of patterns on the mask onto a wafer to transfer the patterns to the wafer. In order to accurately transfer the patterns to the wafer, it is known to use mask patterns on which process proximity effect correction (PPC) has been performed. The PPC is a technique that includes optical proximity effect correction and that corrects patterns on a mask while taking into consideration the effects of development of resists and etching of a wafer in processing steps.

In Japanese Patent Laid-Open No. 2005-84101, it is described that each of elements (cells) included in a circuit pattern having a certain electrical function is subjected to the PPC in advance and saved as a library. Furthermore, it is described that when patterns on a mask are to be created by arranging a plurality of cells selected from libraries adjacent to one another, a process proximity effect generated in boundary portions of the cells is corrected again. In doing so, the time taken to complete calculation may be reduced compared to when mask patterns are created by arranging a plurality of cells that have not been subjected to correction and then the PPC is performed on all the mask patterns.

In Michael C. Smayling et al. "Low k1 Logic Design using Gridded Design Rules", Proc. of SPIE Vol. 6925 (2008), a method for fabricating a circuit pattern called "1D layout technique" is described. In this technique, first, a line-and-space (L/S) pattern of a single pitch is formed on a wafer, and then a plurality of positions are exposed to light though hole patterns. As a result, part of the L/S pattern is cut, and thus a circuit pattern is fabricated. The exposure in this technique is technically easier than in the case of using a two-dimensional pattern that extends both in a vertical direction and in a horizontal direction. In this technique, as in the invention described in Japanese Patent Laid-Open No. 2005-84101, a method for creating mask patterns by arranging a plurality of cells subjected to the PPC and performing the PPC again on boundary portions of the cells is used. The area of each cell included in patterns used in the 1D layout technique is small. When mask patterns are created by arranging a large number of cells whose areas are small adjacent to one another, the areas of boundary portions of the cells occupy most of the areas of the mask patterns. Therefore, when the PPC is again performed on the boundary portions of the small cells subjected to the PPC as in the invention described in Japanese Patent Laid-Open No. 2005-84101, the time taken to complete the calculation of the PPC in the boundary portions becomes long, thereby making the effect of reducing the calculation time less effective.

In calculation adopting only the optical proximity effect correction, the calculation time is shorter than in the case of the PPC, which also includes calculation for the development and the etching, but since the effects of the development and the etching are not taken into consideration, mask patterns are not sufficiently corrected.

SUMMARY OF THE INVENTION

The present invention provides a method for creating mask data that may further reduce calculation time while performing pattern correction that takes into consideration the effects of development and subsequent processes.

Further features of the present invention will become apparent from the following description of exemplary embodiments with reference to the attached drawings.

DESCRIPTION OF THE EMBODIMENTS

First Embodiment

Embodiments of the present invention will be described in detail hereinafter with reference to the accompanying drawings. In this embodiment, data regarding a mask to be used by an exposure apparatus that exposes a substrate to light by illuminating a mask (reticle) using light from a light source and an illumination optical system and projecting images of patterns on the mask onto a wafer (substrate) using a projection optical system is created. An embodiment of the present invention may be applied in order to create data regarding patterns on a mask to be used to manufacture various devices including semiconductor chips such as an integrated circuit (IC) and a large-scale integration (LSI) chip, display devices such as a liquid crystal panel, detection devices such as a magnetic head, and image pickup devices such as a charge-coupled device (CCD) or in micromechatronics.

Figure 1:
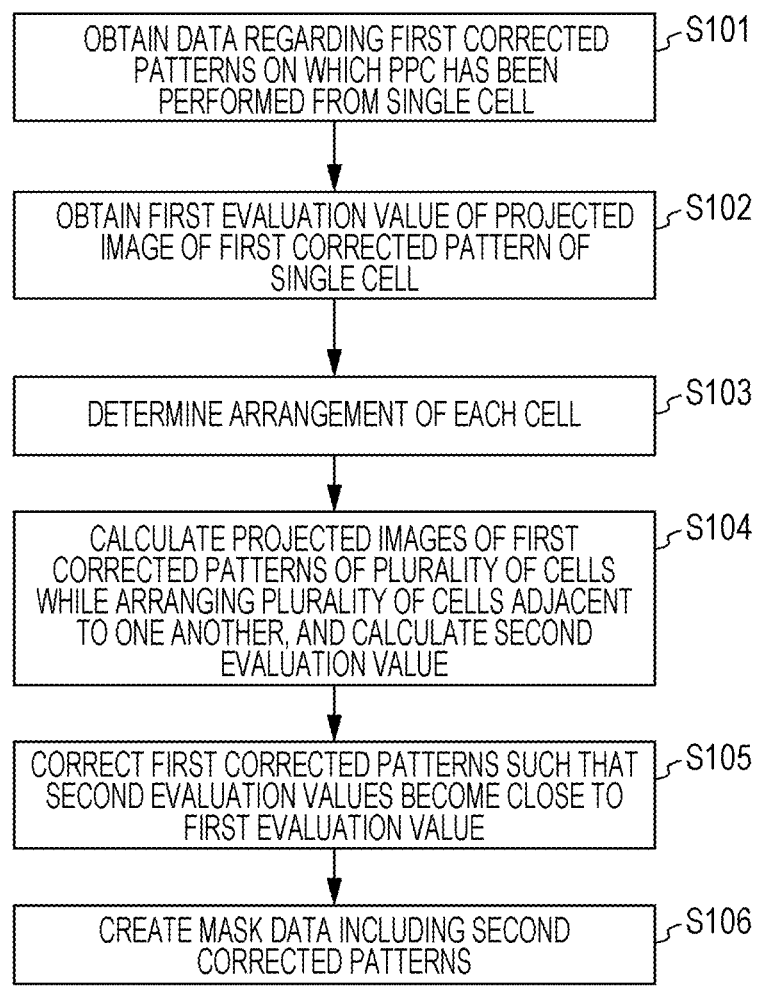
FIG. 1 is a flowchart illustrating a method for creating mask data according to a first embodiment.

FIG. 1 is a flowchart illustrating a method for creating mask data according to this embodiment. The method is used by an information processing apparatus such as a computer. For example, the creation method is implemented when a program for realizing steps illustrated in FIG. 1 has been supplied to the information processing apparatus or an information processing system through a network or a recording medium and the information processing apparatus or the information processing system has read and executed the program stored in a storage medium such as a memory.

In S101, a computer obtains data regarding corrected patterns on a single cell subjected to PPC. In the PPC, correction is performed while taking into consideration development of a substrate and processes after the development such as etching and ion implantation.

Figure 2A:
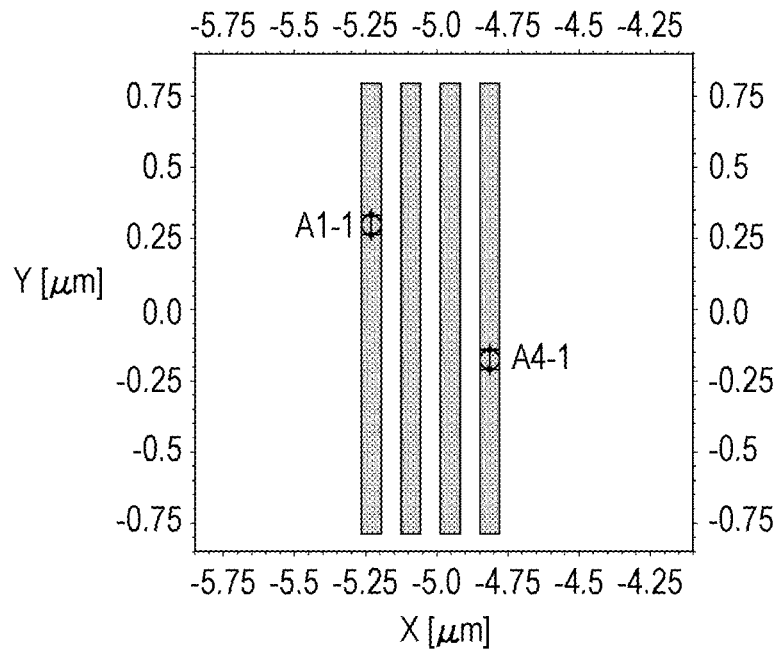
FIGS. 2A and 2B are diagrams illustrating patterns on each cell.
Figure 2B:
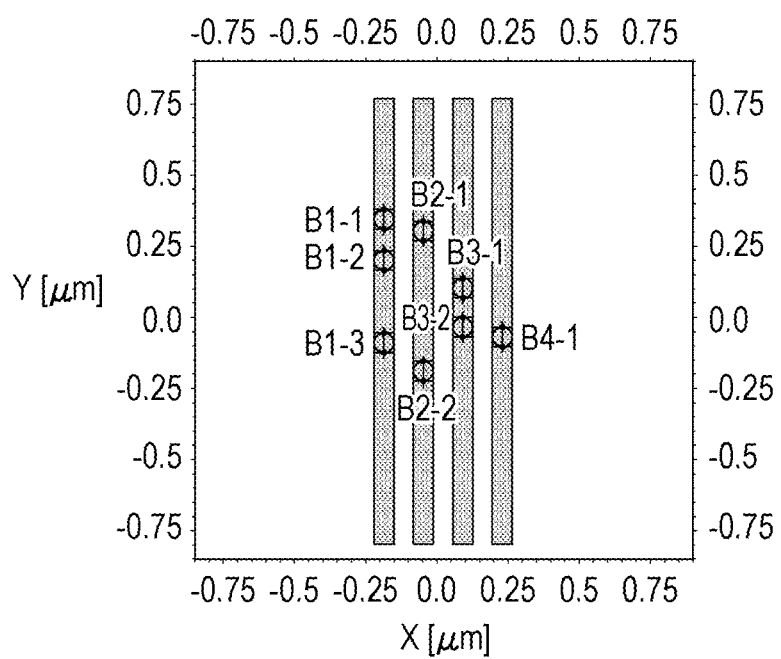

FIG. 2A is a diagram illustrating patterns on Cell A. FIG. 2B is a diagram illustrating patterns on Cell B. Cell A includes rectangular hole patterns A1-1 and A4-1. Cell B includes rectangular hole patterns B1-1 to B4-1. Each hole (pattern element) is used to cut an L/S pattern at a position at which each hole and the L/S pattern overlap. A circle in each rectangular hole indicates the contour of a projected image (optical image) of each hole pattern, and a distance between dots on the contour indicates a critical dimension (CD) of the projected image in a Y direction (vertical direction). In this embodiment, a target value of the dimension of each hole in the Y direction is 70 nm.

First, data regarding images projected onto a wafer when only Cell A whose patterns have not been corrected is disposed in an object plane of the projection optical system of the exposure apparatus is obtained. Next, data regarding resist images formed on the wafer when a resist exposed to light using the projected images has been developed is obtained, and the relationship between the resist images and the patterns on Cell A is obtained. With respect to Cell B, too, data regarding images projected onto a wafer when only Cell B whose patterns have not been corrected is disposed in the object plane of the projection optical system of the exposure apparatus is obtained and data regarding resist images are obtained. The data regarding projected images and the data regarding resist images to be obtained may be results of measurement of the patterns actually formed on the wafer using a scanning electron microscope (SEM) or the like, or may be results of calculation obtained through simulation. An evaluation index such as a dimension (line width), the normalized image log-slope (NILS), or light intensity may be used to evaluate the images.

In this embodiment, resist images of patterns formed on a wafer when images of patterns on a single cell have been projected onto a resist on the wafer and the resist has been developed are calculated using a resist simulator that calculates resist images. Next, dimensions CDR1 of the resist images in the Y direction are calculated as evaluation values. Finally, the dimensions of holes are corrected such that the evaluation values become close to the target value of 70 mm. In the simulation of projected images, images at a best focus position are calculated under a constant amount of exposure while determining the wavelength of the light source to be 193 nm, the numerical aperture (NA) of the projection optical system to be 1.35, and the effective light source distribution (light intensity distribution in a pupil plane of the illumination optical system) to be dipole (double poles). Calculation is independently performed for Cell A and Cell B.

Table 1 indicates dimensions CDM1 of the holes (first corrected patterns) in the Y direction after the correction and the dimensions CDR1 of the resist images in the Y direction generated by the first corrected patterns.

TABLE 1

| Name of hole | Dimension CDM1 of first corrected pattern | Dimension CDR1 of resist image |
|---|---|---|
| A1-1 | 83.7 nm | 70.0 nm |
| A4-1 | 83.7 nm | 70.0 nm |
| B1-1 | 78.6 nm | 69.9 nm |
| B1-2 | 77.7 nm | 69.9 nm |
| B1-3 | 80.2 nm | 70.1 nm |
| B2-1 | 78.5 nm | 69.7 nm |
| B2-2 | 79.7 nm | 70.1 nm |
| B3-1 | 79.7 nm | 70.1 nm |
| B3-2 | 75.9 nm | 69.8 nm |
| B4-1 | 80.8 nm | 70.2 nm |

As can been seen from Table 1, the dimensions of the resist images generated by the holes have become close to the target value, which verifies the effect of the PPC. Each cell including the first corrected patterns corrected in such a manner is saved to a storage unit such as the memory of the computer as a library. A user selects a cell to be used for creating patterns on a mask from libraries. The computer then calls data regarding the selected one of the plurality of cells saved as the libraries to obtain data regarding the first corrected patterns on the cell.

In S102, an evaluation value (first evaluation value) obtained by evaluating a projected image of the first corrected pattern on a single cell generated by the projection optical system is obtained for each cell. First, the projected image of the first corrected pattern on the single cell generated by the projection optical system is calculated. Here, calculation is independently performed for Cell A and Cell B so that Cell A and Cell B are not affected by the optical proximity effect upon each other. The calculated projected images are then evaluated. As the evaluation values, the dimensions of images in the Y direction used in S101 are used. Table 2 indicates dimensions CDO1 (first evaluation values) of the projected images of the first corrected patterns on the cells in the Y direction generated by the projection optical system.

TABLE 2

| Name of hole | Dimension CDO1 of projected image of first corrected pattern on single cell |
|---|---|
| A1-1 | 70.0 nm |
| A4-1 | 70.0 nm |
| B1-1 | 65.2 nm |
| B1-2 | 64.6 nm |
| B1-3 | 69.6 nm |
| B2-1 | 68.1 nm |
| B2-2 | 67.8 nm |
| B3-1 | 64.5 nm |
| B3-2 | 64.4 nm |
| B4-1 | 69.5 nm |

As indicated in Table 2, some dimensions CDO1 are deviated from the target value of 70 nm by as large as about 5 nm. This is because the patterns formed on the wafer are different from the projected images due to the effects of development and etching.

The computer may obtain the dimensions CDO1 of the projected images of the first corrected patterns on the single cell through calculation performed by an arithmetic unit, or may obtain the dimensions CDO1 of the projected images of the first corrected patterns on the single cell by reading data that has been calculated and stored by another computer in advance.

Figure 3:
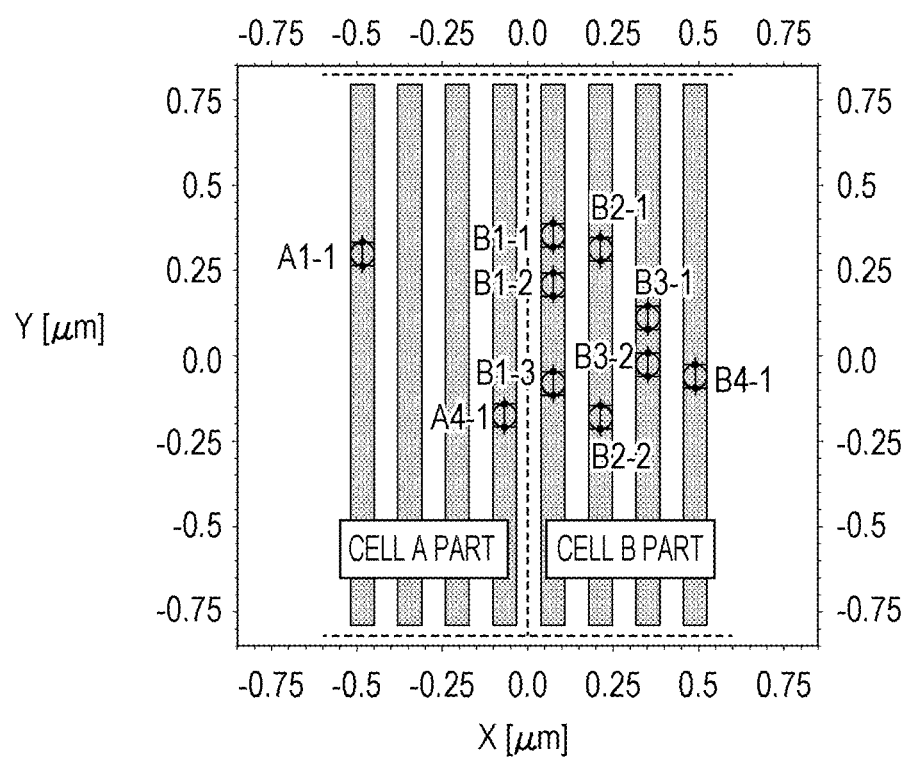
FIG. 3 is a diagram illustrating a case in which Cell A and Cell B are arranged adjacent to each other.

In S103, in order to create patterns on a mask, arrangement of each cell on the mask is determined. FIG. 3 is a diagram illustrating a case in which Cell A and Cell B are arranged adjacent to each other. In this embodiment, Cell A and Cell B are arranged adjacent to each other with a certain distance provided therebetween. The certain distance will be described in detail later.

In S104, the projected images of the first corrected patterns on a plurality of cells when the plurality of cells are arranged adjacent to each other on the mask are calculated, and an evaluation value (second evaluation value) of the projected images is calculated. First, the projected images of the first corrected patterns on Cell A and Cell B when Cell A and Cell B including the first corrected patterns are arranged adjacent to each other are calculated. Next, a dimension CDO2 (second evaluation value) of the projected images in the Y direction is calculated. Table 3 indicates comparisons between the dimensions CDO1 of the projected images of the first corrected patterns on the single cell generated by the projection optical system and the dimensions CDO2 of the projected images of the first corrected patterns in the Y direction at a time when the cells are arranged adjacent to each other.

TABLE 3

| Name of hole | Dimension CDO1 of projected image of first corrected pattern on single cell | Dimension CDO2 of projected image of first corrected pattern of cells when cells are adjacent to each other |
|---|---|---|
| A1-1 | 70.0 nm | 70.0 nm |
| A4-1 | 70.0 nm | 76.5 nm |
| B1-1 | 65.2 nm | 65.2 nm |
| B1-2 | 64.6 nm | 64.9 nm |
| B1-3 | 69.6 nm | 74.5 nm |
| B2-1 | 68.1 nm | 68.6 nm |
| B2-2 | 67.8 nm | 71.8 nm |
| B3-1 | 64.5 nm | 65.1 nm |
| B3-2 | 64.4 nm | 64.8 nm |
| B4-1 | 69.5 nm | 70.5 nm |

As indicated in Table 3, the dimensions CDO1 and CDO2 do not necessarily match. This is because the cells are affected by the optical proximity effect upon each other when the cells are arranged adjacent to each other. Changes in the dimensions of the holes A4-1 and B1-3 are particularly large, which indicates that the optical proximity effect on these holes caused by arranging the cells adjacent to each other is large.

In S105, second corrected patterns are created by correcting the first corrected patterns on Cell A and Cell B arranged adjacent to each other such that the second evaluation value becomes close to the first evaluation value. Next, data regarding a mask including the created second corrected patterns is created (S106). The correction of the patterns is performed by adjusting the biases of the dimensions (lengths of sides) of the rectangular holes. However, the type of correction is not limited to this, and complex correction of dimensions may be performed. The data regarding a mask may include data regarding the transmittance and the phase of the mask.

Table 4 indicates comparisons between the dimensions CDM1 of the first corrected patterns in the Y direction and the dimensions CDM2 of the second corrected patterns in the Y direction.

TABLE 4

| Name of hole | Dimension CDM1 of first corrected pattern | Dimension CDM2 of second corrected pattern |
|---|---|---|
| A1-1 | 83.7 nm | 84.2 nm |
| A4-1 | 83.7 nm | 81.0 nm |
| B1-1 | 78.6 nm | 79.0 nm |
| B1-2 | 77.7 nm | 78.1 nm |
| B1-3 | 80.2 nm | 78.6 nm |
| B2-1 | 78.5 nm | 78.8 nm |
| B2-2 | 79.7 nm | 78.5 nm |
| B3-1 | 79.7 nm | 79.9 nm |
| B3-2 | 75.9 nm | 76.2 nm |
| B4-1 | 80.8 nm | 81.1 nm |

Figure 4:
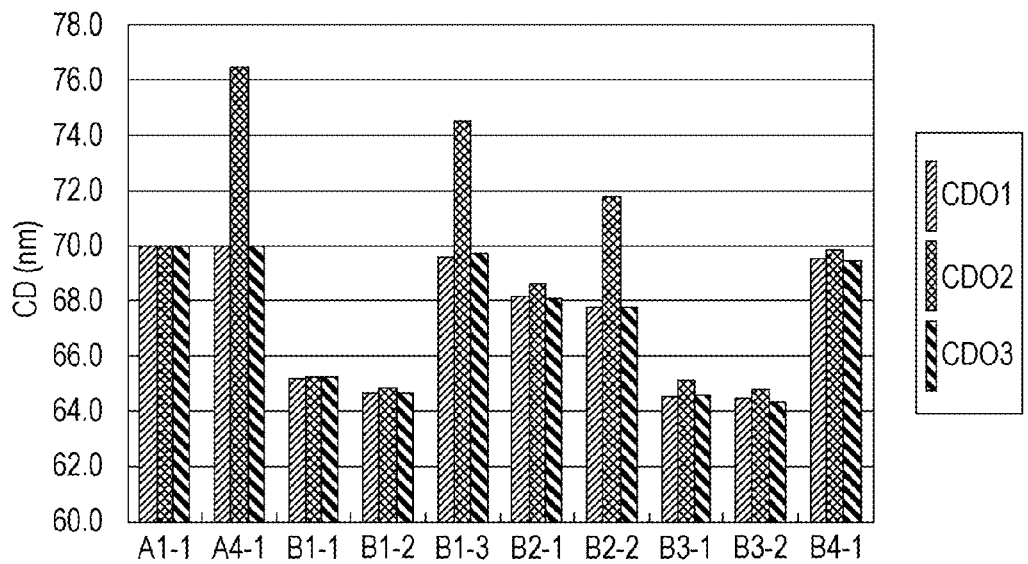
FIG. 4 is a diagram illustrating comparisons between dimensions CDO1 and CDO2 of projected images and dimensions CDO3 of projected images of second corrected patterns in a Y direction.

FIG. 4 is a diagram illustrating comparisons between the dimensions CDO1 and CDO2 of the projected images and dimensions CDO3 of the projected images of the second corrected patterns in the Y direction. Whereas the root mean square (RMS) of the differences between the dimensions CDO1 and CDO2 is 2.90 nm, the RMS of the differences between the dimensions CDO1 and CDO3 is 0.06 nm, which indicates that the dimensions CDO1 and CDO3 are substantially the same.

Thus, by correcting the first corrected patterns on the plurality of cells adjacent to each other such that the second evaluation values become close to the first evaluation values, the projected images of the second corrected patterns become substantially the same as the projected images of the first corrected patterns on a single cell. Therefore, resist images of the second corrected patterns are expected to have the same dimensions CDR1 as the resist images of the first corrected patterns on a single cell. Accordingly, since the second corrected patterns obtained by calculating only the projected images take into consideration correction corresponding to the effect of the development process, patterns close to the target value may be formed on the wafer using the second corrected patterns. In addition, since only the calculation of the projected images is performed without calculating resist images when the second corrected patterns are created by correcting the first corrected patterns, the time taken to complete the calculation may be reduced.

Figure 5:
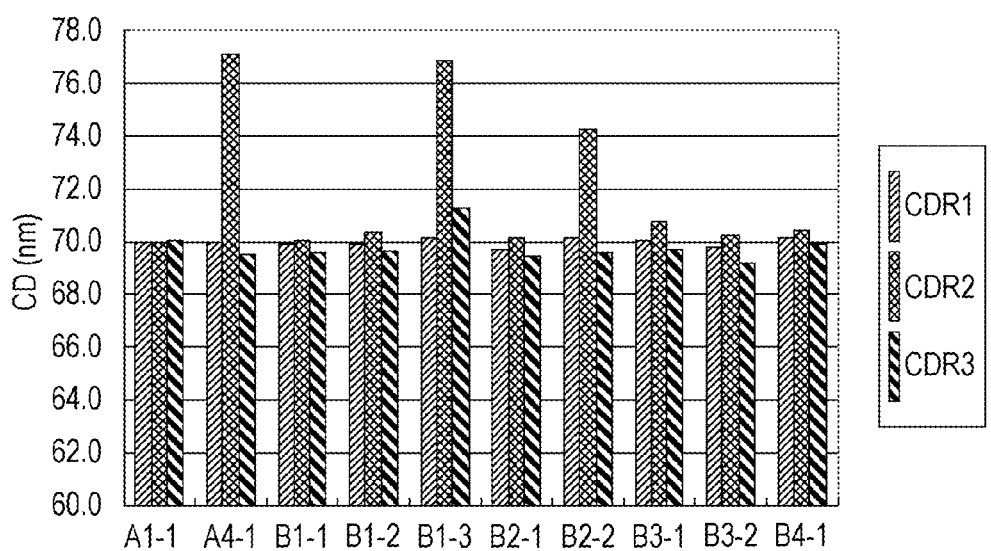
FIG. 5 is a diagram illustrating comparisons between dimensions CDR1, CDR2, and CDR3 of resist images.

Next, the validity of the creation method according to this embodiment will be described. Resist images are calculated using the second corrected patterns determined in this embodiment, and dimensions CDR3 of the resist images in the Y direction are obtained. In addition, for the purpose of comparison, the resist images of the first corrected patterns when the cells are arranged adjacent to each other are calculated, and dimensions CDR2 of the resist images are obtained. FIG. 5 is a diagram illustrating comparisons between the dimensions CDR1, CDR2, and CDR3 of the resist images. As can be seen from FIG. 5, whereas the RMS of the differences between the dimensions CDR1 and CDR2 is 3.38 nm, the RMS of the differences between the dimensions CDR1 and CDR3 is 0.50 nm, which indicates that the dimensions CDR1 and CDR3 are substantially the same. The time taken to complete the calculation is 41 seconds in the calculation of the resist images performed in S101 whereas it is 11 seconds in the calculation of only the projected images. That is, by calculating only the projected images, the time taken to complete the calculation may be reduced.

Figure 6A:
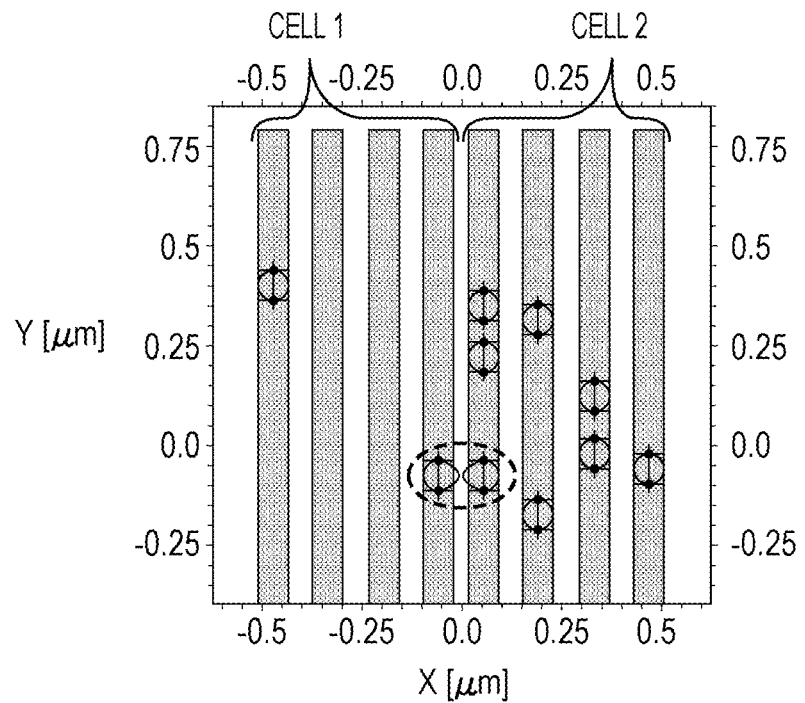
FIGS. 6A and 6B are diagrams illustrating determination of a distance between cells.
Figure 6B:
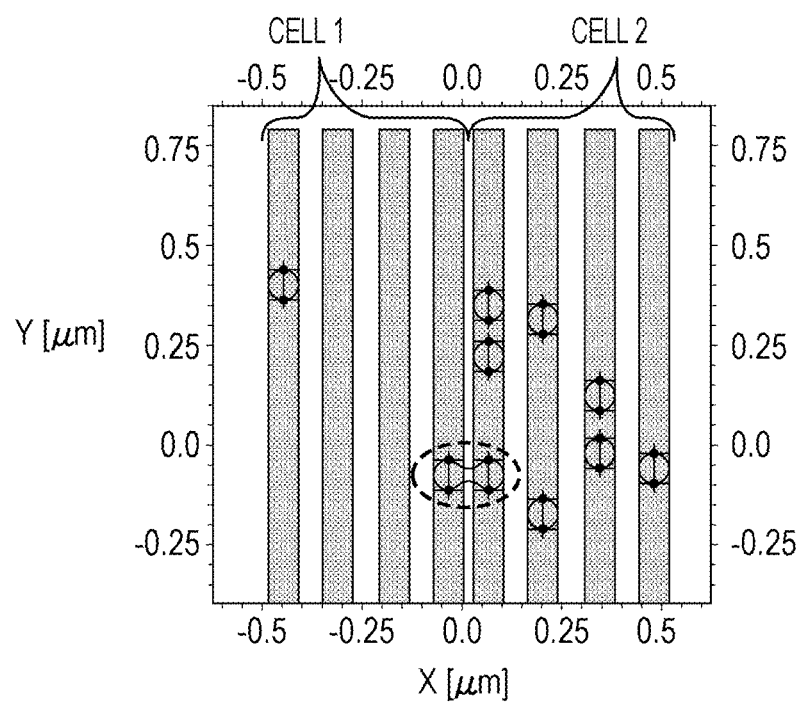

In S103, Cell A and Cell B are arranged adjacent to each other with a distance of 86.0 nm, which exceeds 0.36×λ/NA=51.5 nm, provided therebetween. The reason why Cell A and Cell B are arranged adjacent to each other with a distance L that exceeds 0.36×λ/NA provided therebetween will be described. FIGS. 6A and 6B are diagrams illustrating the projected images of the second corrected patterns at a time when the second corrected patterns have been created using the creation method according to this embodiment while arranging Cell A and Cell B adjacent to each other. FIG. 6A illustrates a case in which L≥51.5 nm (k1≥0.36), and FIG. 6B illustrates a case in which L<51.5 nm (k1<0.36). Cell A and Cell B have been moved from the arrangement illustrated in FIG. 3 in the Y direction by certain distances for the purpose of examination.

Although correction of the Y dimensions may be achieved in both FIG. 6A and FIG. 6B, a "bridge" is undesirably generated between the holes illustrated in FIG. 6B in a portion surrounded by a broken line, and the projected images are connected to each other. Therefore, it may be considered that a limit to the distance for enabling adjacent arrangement exists somewhere between the distance L set in FIG. 6A and the distance L set in FIG. 6B. Since k1 at this time is 0.36, the cells are arranged adjacent to each other with the distance L that exceeds 0.36×λ/NA provided therebetween in S103. That is, the plurality of cells include patterns in which some projected images of the first corrected patterns are connected to each other when the plurality of cells are arranged adjacent to each other with a distance shorter than a certain distance provided therebetween. Therefore, the certain distance or a distance that exceeds the certain distance needs to be provided so that some projected images of the first corrected patterns are not connected to each other.

Although the best focus position and a constant amount of exposure are used as the conditions in the above description, a plurality of focus positions and a plurality of amounts of exposure may be used as the conditions, instead. In addition, auxiliary patterns that generate no images may be added to hole patterns as patterns on a cell or a mask.

Although a case in which two cells are arranged horizontally adjacent to each other has been described as an example, two cells may be arranged vertically or diagonally adjacent to each other or three or more cells may be arranged adjacent to one another, instead. In addition, a boundary portion of cells may be determined, and pattern correction using the method according to this embodiment may be performed only on the boundary portion, instead.

Although cells having patterns in which a plurality of holes are separately provided are used in this embodiment, cells having holes that are horizontally connected to one another may be applied, instead. In addition, although hole patterns are used as a type of pattern included in cells in this embodiment, line patterns or the like may be used, or cells including various patterns may be used, instead.

In addition, the same effects may be produced using images obtained by performing convolution integration on projected images using a Gaussian function regarding a distance or the like as the projected images of patterns generated by the projection optical system. This is because the calculation of convolution integration using a Gaussian function or the like is simple and does not take much time.

Second Embodiment

Figure 7:
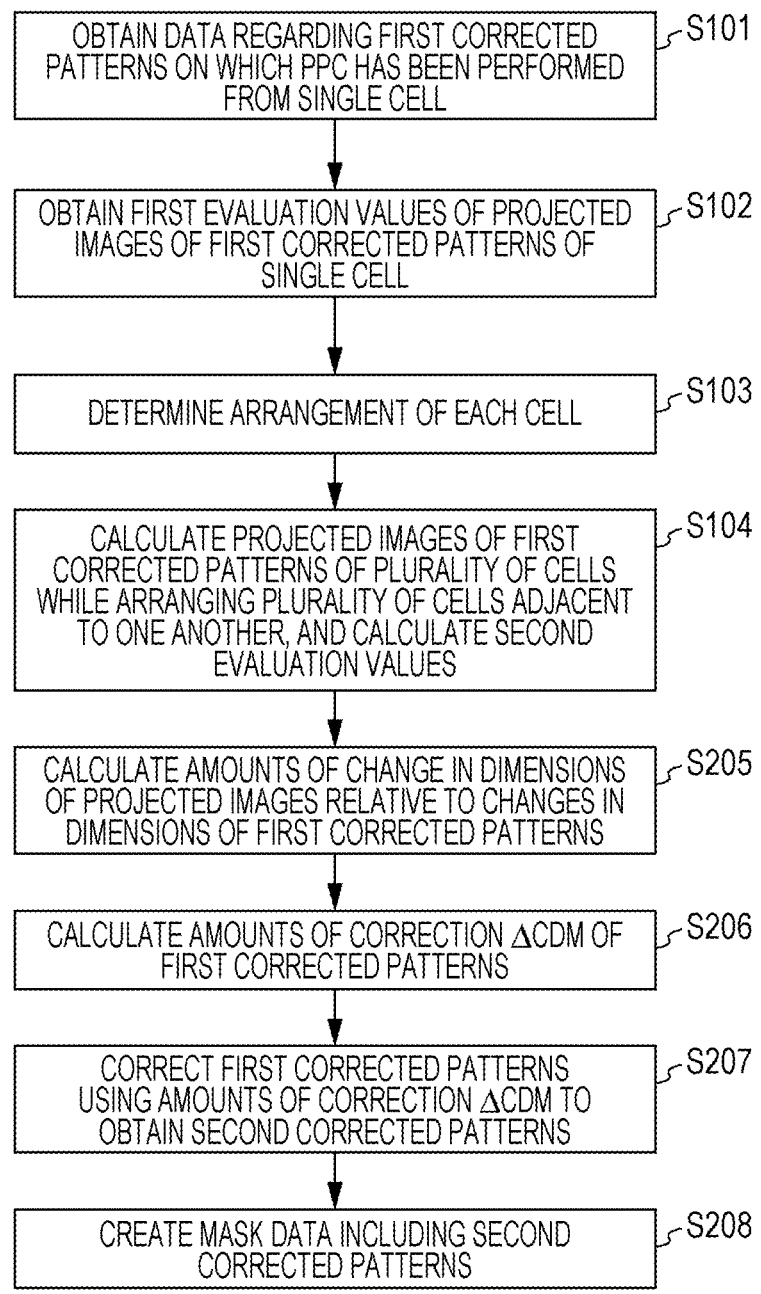
FIG. 7 is a flowchart illustrating a method for creating mask data according to a second embodiment.

In a second embodiment, a method for creating mask patterns using the rate of change in the dimensions of projected images relative to changes in the dimensions of the mask patterns. FIG. 7 is a flowchart illustrating a method for determining mask patterns according to the second embodiment.

In S205, the amounts of change in the dimensions of the projected images relative to changes in the dimensions of the first corrected patterns at a time when Cell A and Cell B are arranged adjacent to each other are calculated. First, the amount of exposure when dimensions are calculated on the wafer is determined such that the vertical dimension of the pattern A1-1 illustrated in FIG. 3 becomes 70 nm. Next, amounts of change (rates of change) ΔCDO in the dimensions of the projected images when the dimensions of the hole patterns A4-1 to B4-1 are increased by 1 nm (unit amount) are calculated under the determined amount of exposure.

In S206, amounts of correction ΔCDM of the dimensions of the holes are calculated. Here, the differences between the dimensions CDO2 and CDO1 are divided by the amounts of change ΔCDO while assuming that the amounts of change in the dimensions of the holes and the amounts of change ΔCDO are proportional to each other. By determining resultant values to be the amounts of correction ΔCDM of the dimensions of the holes, the dimensions CDO2 match the dimensions CDO1. In S207, the first corrected patterns are corrected by the amounts of correction ΔCDM to calculate dimensions CDM3 of the corrected hole patterns (second corrected patterns). In S208, the second corrected patterns are determined as the mask patterns, and mask data including the second corrected patterns is created.

The values calculated in steps S205 and S206 in this embodiment are as indicated in Table 5.

TABLE 5

| Name of hole | Dimension CDM1 of first corrected pattern | Amount of change ΔCDO in dimension of projected image | Amount of correction ΔCDM of dimension | Dimension CDM3 of corrected hole pattern |
|---|---|---|---|---|
| A1-1 | 83.7 nm | — | — | 83.7 nm |
| A4-1 | 83.7 nm | 1.84 nm | −3.53 nm | 80.2 nm |
| B1-1 | 78.6 nm | 2.14 nm | −0.02 nm | 78.6 nm |
| B1-2 | 77.7 nm | 2.16 nm | −0.11 nm | 77.6 nm |
| B1-3 | 80.2 nm | 1.90 nm | −2.61 nm | 77.6 nm |
| B2-1 | 78.5 nm | 2.08 nm | −0.23 nm | 78.3 nm |
| B2-2 | 79.7 nm | 2.01 nm | −2.01 nm | 77.7 nm |
| B3-1 | 79.7 nm | 2.18 nm | −0.27 nm | 79.4 nm |
| B3-2 | 75.9 nm | 2.23 nm | −0.15 nm | 75.8 nm |
| B4-1 | 80.8 nm | 1.97 nm | −0.18 nm | 80.6 nm |

Figure 8:
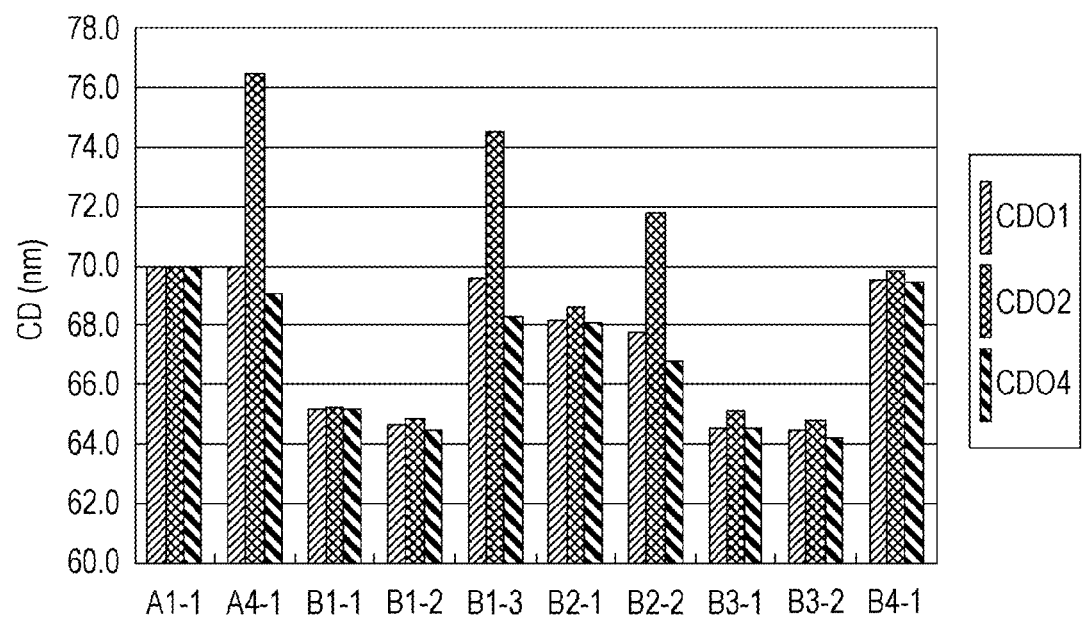
FIG. 8 is a diagram illustrating comparisons between dimensions CDO4 of projected images of holes and the dimensions CDO1 and CDO2.

FIG. 8 illustrates results of comparisons between dimensions CDO4 of the projected images of the holes calculated using the mask pattern created in this embodiment and the dimensions CDO1 and CDO2. As can be seen from FIG. 8, whereas the RMS of the differences between the dimensions (CDs) CDO1 and CDO2 is 2.90 nm, the RMS of the differences between the dimensions (CDs) CDO1 and CDO4 is 0.60 nm.

A mask is manufactured by a mask manufacturing apparatus such as an electron beam drawing apparatus. More specifically, a mask on which patterns are drawn is manufactured by inputting the created mask data to the mask manufacturing apparatus and drawing the patterns on a mask blank on the basis of the input data.

A method for manufacturing a semiconductor device using the above-described exposure apparatus will be described. First, the mask manufactured in the above-described manner is mounted on the exposure apparatus, and a substrate to which a photosensitizing agent (resist) has been applied is exposed to light. The exposure apparatus illuminates the mask (reticle) using light from the light source and the illumination optical system, and the images of the patterns on the mask are projected onto a wafer (substrate) using the projection optical system, thus exposing the substrate to light. The substrate exposed to light is then developed. Furthermore, the method for manufacturing a semiconductor device may include other known processes (oxidation, deposition, vapor deposition, doping, smoothing, etching, resist peeling, dicing, bonding, packaging, and the like).

Other Embodiments

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-203005, filed Sep. 14, 2012, which is hereby incorporated by reference herein in its entirety.

What is claimed is:

1. A method for creating data regarding a mask to be used by an exposure apparatus that exposes a substrate by illuminating the mask and projecting an image of pattern on the mask onto the substrate using a projection optical system, the method being executed by a computer, the method comprising the steps of:
    obtaining, for each of a plurality of cells, data regarding a first corrected pattern on a single cell corrected such that an evaluation value of a pattern formed on the substrate after an image of a pattern on the single cell is projected onto a resist on the substrate and the resist is developed become close to a target value;
    obtaining, for each of the plurality of cells, a first evaluation value obtained by evaluating a projected image of the first corrected pattern on the single cell generated by the projection optical system;
    calculating, when the plurality of cells are arranged adjacent to one another, a second evaluation value obtained by evaluating the projected images of the first corrected patterns on the plurality of cells generated by the projection optical system;
    creating second corrected patterns by correcting the first corrected patterns on the plurality of cells arranged adjacent to one another such that the second evaluation value becomes close to the first evaluation value; and
    creating the data regarding the mask including the second corrected patterns on the plurality of cells arranged adjacent to one another.

2. The method according to claim 1,
    wherein each of the plurality of cells is a cell whose patterns are different from those formed on the other cells.

3. The method according to claim 1,
    wherein the plurality of cells include patterns in which some projected images of the first corrected patterns are connected to each other when the plurality of cells are arranged adjacent to one another with a distance shorter than a certain distance provided between the plurality of cells, and
    wherein the plurality of cells are arranged adjacent to one another such that some projected images of the first corrected patterns are not connected to each other.

4. The method according to claim 3,
    wherein the certain distance is 0.36×λ/NA when a wavelength of light illuminating the mask is denoted by λ and a numerical aperture of the projection optical system is denoted by NA.

5. The method according to claim 3,
    wherein the plurality of cells are arranged adjacent to one another with the certain distance provided between the plurality of cells.

6. The method according to claim 1,
    wherein the first evaluation value and the second evaluation value are dimensions of a pattern, and
    wherein an amount of change in a dimension of the projected image of the first corrected pattern when dimensions of the first corrected patterns have been changed by a unit amount is calculated, and the first corrected pattern is corrected using the amount of change and differences between the first evaluation value and the second evaluation value.

7. The method according to claim 6,
    wherein the first corrected pattern includes a plurality of pattern elements, and
    wherein the amount of change is calculated for each of the pattern elements.

8. The method according to claim 1,
    wherein an image obtained by performing convolution integration on the projected images using a Gaussian function regarding a distance is used as the projected image generated by the projection optical system.

9. A program for causing a computer to execute the method according to claim 1.

10. An information processing apparatus or an information processing system that executes the method according to claim 1.

11. A method for manufacturing a mask, the method comprising the steps of:
    creating data regarding the mask using the method according to claim 1; and
    manufacturing the mask using the created data regarding the mask.

12. An exposure method comprising the steps of:
    manufacturing a mask using the method for manufacturing a mask according to claim 11; and
    exposing a substrate through an image of pattern on the mask using the manufactured mask.

13. A method for manufacturing a device, the method comprising the steps of:
    exposing a substrate using the exposure method according to claim 12; and
    developing the exposed substrate.

* * * * *